US012726185B2

(12) United States Patent
Liu et al.

(10) Patent No.: US 12,726,185 B2
(45) Date of Patent: Sep. 1, 2026

(54) DELAY CLOCK CIRCUIT, SIGNAL TRANSMISSION DEVICE AND A METHOD FOR DETERMINING DELAY

(71) Applicants: Haining ESWIN Computing Technology Co., Ltd., Jiaxing (CN); Beijing ESWIN Computing Technology Co., Ltd., Beijing City (CN)

(72) Inventors: Xiaoqing Liu, Beijing City (CN); Lei Qi, Beijing City (CN)

(73) Assignees: Haining ESWIN Computing Technology Co., Ltd., Jiaxing (CN); Beijing ESWIN Computing Technology Co., Ltd., Beijing City (CN)

( * ) Notice: Subject to any disclaimer, the term of this patent is extended or adjusted under 35 U.S.C. 154(b) by 8 days.

(21) Appl. No.: 18/910,358

(22) Filed: Oct. 9, 2024

(65) Prior Publication Data

US 2025/0119128 A1 Apr. 10, 2025

(30) Foreign Application Priority Data

Oct. 9, 2023 (CN) ........................ 202311314290.2

(51) Int. Cl.
*H03K 5/01* (2006.01)
*H03K 21/08* (2006.01)
*H03K 5/00* (2006.01)

(52) U.S. Cl.
CPC ............... *H03K 5/01* (2013.01); *H03K 21/08* (2013.01); *H03K 2005/00078* (2013.01)

(58) Field of Classification Search
CPC . H03K 5/01; H03K 21/08; H03K 2005/00078
(Continued)

(56) References Cited

U.S. PATENT DOCUMENTS

2015/0346831 A1* 12/2015 Nii ........................ G11B 27/00 345/173

FOREIGN PATENT DOCUMENTS

JP H05225655 * 9/1993

* cited by examiner

*Primary Examiner* — Leila Malek
(74) *Attorney, Agent, or Firm* — Mendelsohn Dunleavy, P.C.; Kevin J. Dunleavy

(57) ABSTRACT

The present application provides a delay clock circuit, a signal transmission device and a method for determining delay, and relates to the field of circuit technologies. The delay clock circuit includes: a self-activation module, including a first inverter and a delay circuit, and used for generating a self-activation clock signal, where the first inverter is connected to an input end of the delay circuit and an output end of the delay circuit respectively; a first counter, connected to the self-activation module, and used for starting to work under a drive of the self-activation clock signal and a start counting signal and stopping working under a drive of a stop counting signal to obtain a first counting result within a preset duration; and a count processing module, connected to the first counter, and used for obtaining a delay of the delay circuit based on the preset duration and the first counting result. The present application can perform calculations based on an accumulated delay counted by the first counter to obtain an accurate delay of the delay circuit. Therefore, an application requirement of a controllable and flexible adjustable delay of the delay circuit in different scenarios is satisfied, and stable and reliable data transmission is achieved.

18 Claims, 5 Drawing Sheets

(58) Field of Classification Search
USPC .......................................................... 375/354
See application file for complete search history.

DELAY CLOCK CIRCUIT, SIGNAL TRANSMISSION DEVICE AND A METHOD FOR DETERMINING DELAY

FIELD

The present application relates to the field of circuit technologies, and in particular to a delay clock circuit, a signal transmission device and a method for determining delay.

BACKGROUND

In a data transmission protocol, it is generally agreed that both a clock and data are generated by a transmitting source and transmitted to a receiving source through an input and output interface and signal routing. For example, for a unidirectional data bus with a data width of four bits, whose both clock edges carry valid data, eight bits of data may be transmitted in one valid clock cycle, which increases data throughput.

However, compared with an ordinary signal, this high-efficiency signal is more susceptible to uncertain interference factors during transmission, which leads to a decrease in signal transmission quality.

Therefore, when a working environment of a circuit is not ideal, an impact of interference factors on the quality of the high-efficiency signal is further amplified, and the receiving source often cannot accurately and stably sample data, which leads to an error in data transmission. A usual solution is to introduce a delay between the clock and the data, to align a stable area of the data with a clock edge, thereby ensuring that the receiving source can stably sample valid data, to reduce a probability of the error in data transmission.

The delay can be achieved through printed circuit board (PCB) routing or internal delay of a transmitting node or a receiving node. However, in actual production applications, delays of a signal under different processes and different temperatures are inconsistent due to different circuit usage scenarios, which leads to different delays in different usage scenarios. Since the delay is not clear, it is difficult to effectively control a size of the delay and unable to align the stable area of the data with a clock edge, which leads to the error in data transmission.

BRIEF SUMMARY

The present application provides a delay clock circuit, a signal transmission device and a method for determining delay, which are used to solve a defect in the related art that a delay of a delay circuit in different application scenarios cannot be obtained, resulting in an inability to effectively control the delay and an error in data transmission.

The present application provides a delay clock circuit, including: a self-activation module, including a first inverter and a delay circuit, and used for generating a self-activation clock signal, where the first inverter is connected to an input end of the delay circuit and an output end of the delay circuit respectively; a first counter, connected to the self-activation module, and used for starting to work under a drive of the self-activation clock signal and a start counting signal and stopping working under a drive of a stop counting signal to obtain a first counting result within a preset duration, where the preset duration is a time interval between the start counting signal and the stop counting signal; and a count processing module, connected to the first counter, and used for obtaining a delay of the delay circuit based on the preset duration and the first counting result.

According to the delay clock circuit provided by the present application, the start counting signal is generated by a central processing unit, and the stop counting signal is generated by a preset duration module including a second counter and a comparator, where an input end of the second counter is connected to a reference clock interface, the second counter is used for working under a drive of a reference clock signal and the start counting signal to obtain a second counting result; a first input end of the comparator is connected to an output end of the second counter to obtain the second counting result, a second input end of the comparator is connected to the central processing unit to obtain a preset value, and an output end of the comparator is connected to the first counter; and the comparator is used for comparing the second counting result with the preset value, and generating the stop counting signal in case that the second counting result is equal to the preset value, where the preset duration is determined based on a reference clock cycle of the reference clock signal and the second counting result.

According to the delay clock circuit provided by the present application, the delay clock circuit further includes a synchronizer, where a first input end of the first counter is connected to an output end of the self-activation module; and the synchronizer is arranged between the output end of the comparator and a second input end of the first counter, and is used for synchronizing signal transmission between a reference clock domain of the reference clock signal and a self-activation clock domain of the self-activation clock signal.

According to the delay clock circuit provided by the present application, the delay circuit includes a second inverter, a first multiplexer and a delay chain, where an input end of the second inverter is connected to an input clock interface, a first input end of the first multiplexer is connected to an output end of the second inverter, a second input end of the first multiplexer is connected to the input clock interface, an output end of the first multiplexer is connected to an input end of the delay chain, and the delay chain outputs a delay clock signal; the delay chain includes a plurality of cascaded delay units and a second multiplexer, where each delay unit is connected to the second multiplexer; and a control end of the second multiplexer is connected to the central processing unit, and a delay tap coefficient of the delay chain is determined based on a control instruction of the central processing unit, where the delay tap coefficient is used for determining a number of delay units in the delay chain.

According to the delay clock circuit provided by the present application, the count processing module includes a divider connected to an output end of the first counter, where the divider determines delays of each delay unit based on the preset duration, the first counting result, a first parameter and the delay tap coefficient, where the first parameter is associated with a duty cycle of the self-activation clock signal.

According to the delay clock circuit provided by the present application, the delay clock circuit further includes: a central processing unit, used for controlling a delay clock output from the delay circuit based on the delay, where the delay changes with working conditions.

The present application further provides a signal transmission device, including a signal processing circuit, a signal transmission circuit and the above-mentioned delay clock circuit, where the delay clock circuit is used for determining a delay of the delay circuit; the signal processing circuit is used for introducing a skew determined based on the delay between clock information and data information to obtain target data, where the skew is determined based on the delay, or the signal processing circuit is used for determining to introduce a skew between clock information and data information based on the delay and target data, where the skew is determined based on the delay and target data; and the signal transmission circuit is used for transmitting the target data to a receiver, or to receiving the target data transmitted from a transmitter.

The present application further provides a method for determining delay of delay clock circuit, including: generating a self-activation clock signal; starting to work under a drive of the self-activation clock signal and a start counting signal; stopping working under a drive of a stop counting signal, and obtaining a first counting result within a preset duration, where the preset duration is a time interval between the start counting signal and the stop counting signal; and obtaining a delay of a delay circuit based on the preset duration and the first counting result.

According to the method for determining delay of delay clock circuit provided by the present application, before starting to work under the drive of a self-activation clock signal and a start counting signal, the method further includes: generating a start counting signal; working under a drive of a reference clock signal and the start counting signal to obtain a second counting result; and before the step of stopping working under the drive of the stop counting signal, and obtaining the first counting result within the preset duration, the method further includes: receiving a preset value output from a central processing unit; and generating the stop counting signal in case that the second counting result is equal to the preset value, where the preset duration is determined based on a reference clock cycle of the reference clock signal and the second counting result.

According to the method for determining delay of delay clock circuit provided by the present application, obtaining the delay of the delay circuit based on the preset duration and the first counting result includes: determining a delay tap coefficient of a delay chain based on a control instruction of the central processing unit, where the delay tap coefficient is used for determining a number of delay units in the delay chain; and determining delays of each delay unit based on the preset duration, the first counting result, a first parameter and the delay tap coefficient, where the first parameter is associated with a duty cycle of the self-activation clock signal.

According to the method for determining delay of delay clock circuit provided by the present application, after obtaining the delay of the delay circuit based on the preset duration and the first counting result, the method further includes: controlling a delay clock output from the delay circuit based on the delay, where the delay changes with working conditions.

The present application provides a delay clock circuit, a signal transmission device and a method for determining delay. The delay clock circuit includes: a self-activation module, a first counter and a count processing module. The self-activation module includes a first inverter and a delay circuit, and used for generating a self-activation clock signal, where the first inverter is connected to an input end of the delay circuit and an output end of the delay circuit respectively. The first counter is used for starting to work under a drive of the self-activation clock signal and a start counting signal, and stopping working under a drive of a stop counting signal, to obtain a first counting result within a preset duration. The count processing module is used for obtaining a delay of the delay circuit based on the preset duration and the first counting result. Through the above modes, the first counter starts to count under the drive of the self-activation clock signal, and compares the first counting result with the preset duration. Calculations associated with an accumulated delay of the delay circuit can be performed, and an accurate delay of the delay circuit is obtained. The delay of the delay circuit may characterize working parameters of the delay circuit in different application scenarios. Therefore, an application requirement of a controllable and flexible adjustable delay of the delay circuit in different scenarios is satisfied, and stable and reliable data transmission is achieved.

BRIEF DESCRIPTION OF THE DRAWINGS

In order to illustrate the solutions in the embodiments of the present application or in the related art more clearly, the drawings used in the description of the embodiments or the related art are briefly described below. The drawings in the following description are only some embodiments of the present application, and other drawings may be obtained according to these drawings without any creative work for those skilled in the art.

DETAILED DESCRIPTION

In order to illustrate the objects, solutions and advantages of the application, the solutions in present the application will be described clearly and completely below in combination with the drawings in the application. The described embodiments are part of the embodiments of the application, not all of them. All other embodiments obtained by a person of ordinary skill in the art based on the embodiments of the present application without any creative work belong to the scope of the present application.

The present application provides a delay clock circuit, which is a delay circuit with controllable delay and capable of accurately adjusting a delay step. The following takes an application scenario of the reduced gigabit media independent interface (RGMII) data transmission protocol as an example for a detailed description.

It should be noted that the delay clock circuit of the present application may not only be applied to the RGMII data transmission protocol, but may be further applied to other data transmission protocols by those skilled in the art.

The RGMII is an abbreviation of a simplified gigabit media independent interface (GMII) interface, whose unidirectional data bus has a data width of four bits, a maximum operating clock frequency of 125 MHz, and transmits data simultaneously on a rising edge and a falling edge, so the transmission rate can reach 1000 Mbps. The RGMII interface is compatible with a working mode of 10/100 Mbps, which is specified by a medium independent interface (MII) at the same time, and supports transmission of three rate modes of 10 M/100 M/1000 Mbps. Adopting the RGMII interface can effectively reduce a circuit cost and reduce a number of pins of such interface chips from 25 to 14. Therefore, it is widely used in many fields such as network card switches.

Figure 1:
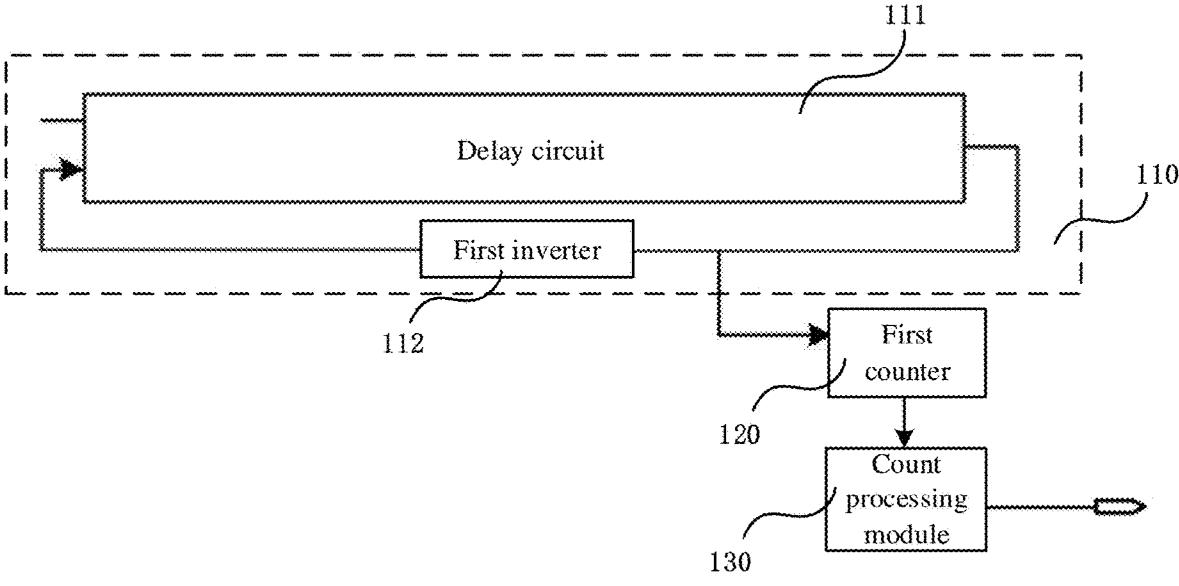
FIG. 1 is a first schematic structural diagram of a delay clock circuit according to an embodiment of the present application.

Referring to FIG. 1, FIG. 1 is a first schematic structural diagram of a delay clock circuit according to an embodiment of the present application. In this embodiment, the delay clock circuit includes a self-activation module 110, a first counter 120 and a count processing module 130.

The self-activation module 110 includes a first inverter 112 and a delay circuit 111, and is used for generating a self-activation clock signal, where the first inverter 112 is connected to an input end of the delay circuit 111 and an output end of the delay circuit 111 respectively.

The delay circuit 111 is a main component of the delay clock circuit. The first inverter 112 may be used for controlling positive and negative phases of a clock. A clock reversal makes the delay circuit with a same delay size have a smaller area, and the fewer combinational logic units are required to build the circuit.

The self-activation module 110 is a circuit structure in which an input and an output of the delay circuit 111 are connected through an inverter. When the circuit is powered on, this special structure will self-activate a sinusoidal wave signal with a constant cycle, and the first counter 120 is driven by the signal for counting, and a standard delay time is calculated together to obtain an accurate delay size of the delay circuit.

The first counter 120 is connected to the self-activation module 110, and is used for starting to work under a drive of the self-activation clock signal and a start counting signal and stopping working under a drive of a stop counting signal to obtain a first counting result within a preset duration. The preset duration is a time interval between the start counting signal and the stop counting signal.

The count processing module 130 is connected to the first counter 120, and is used for obtaining a delay of the delay circuit based on the preset duration and the first counting result. By combining the first counter 120 with the count processing module 130, the delay size of the delay circuit can be accurately calculated.

A working principle of the delay clock circuit is as follows. In case that the circuit is powered on, an output signal of the delay circuit is connected to the input end of the delay circuit through the first inverter. After the signal is stabilized for a period, the circuit will self-activate to form a self-activation clock signal with a jump of 0101. A half cycle of the self-activation clock signal is a maximum delay of the delay circuit, and the self-activation clock signal can drive the first counter.

The preset duration T is a test time for a delay set by the central processing unit. Specifically, the first counter is controlled to start counting within the preset duration by the start counting signal and the stop counting signal to obtain the first counting result n. The delay D of the delay circuit is obtained based on the preset duration T and the first counting result n. Therefore, in case that the duty cycle of the self-activation clock signal is 50%, $D=T/n/2$.

The delay of the delay circuit would change with the working conditions, and can be re-measured as the working conditions change. The central processing unit can control the delay circuit in different working scenarios based on the delay of the delay circuit, a stable area of transmitted data is aligned with a clock edge, thereby ensuring that a reception source can stably sample valid data to reduce the probability of an error in data transmission.

This embodiment provides a delay clock circuit, and the delay clock circuit includes a self-activation module, a first counter and a count processing module. The self-activation module includes a first inverter and a delay circuit, and used for generating a self-activation clock signal, where the first inverter is connected to an input end of the delay circuit and an output end of the delay circuit respectively. The first counter is used for starting to work under a drive of the self-activation clock signal and a start counting signal, and stopping working under a drive of a stop counting signal, to obtain a first counting result within a preset duration. The count processing module is used for obtaining a delay of the delay circuit based on the preset duration and the first counting result. Through the above modes, the first counter starts to count under the drive of the self-activation clock signal, and compares the first counting result with the preset duration. Calculations associated with an accumulated delay of the delay circuit can be therefore performed, and an accurate delay of the delay circuit is finally obtained. The delay of the delay circuit may characterize working parameters of the delay circuit in different application scenarios. Therefore, an application requirement of a controllable and flexible adjustable delay of the delay circuit in different scenarios is satisfied, and stable and reliable data transmission is achieved.

In an embodiment, both the start counting signal and the stop counting signal may be generated by the central processing unit.

In an embodiment, the start counting signal may be generated by the central processing unit, and the stop counting signal may be generated by a preset duration module. The preset duration module may include a second counter and a comparator.

An input end of the second counter is connected to a reference clock interface, the second counter is used for working under a drive of a reference clock signal and the start counting signal to obtain a second counting result.

A first input end of the comparator is connected to an output end of the second counter to obtain the second counting result, a second input end of the comparator is connected to the central processing unit to obtain a preset value, and an output end of the comparator is connected to the first counter; and the comparator is used for comparing the second counting result with the preset value, and generating the stop counting signal in case that the second counting result is equal to the preset value.

The preset duration is determined based on a reference clock cycle of the reference clock signal and the second counting result. The comparator is used for comparing a magnitude relationship between a count value (the second counting result) and a nominal value (the preset value) and generate a control signal. The preset duration may be accurately determined by the cooperation of the second counter and the comparator. If the reference clock cycle is t and the second counting result is k, the preset time T is expressed as: $T=t*k$.

In an embodiment, the delay clock circuit further includes a synchronizer. A first input end of the first counter is connected to an output end of the self-activation module. The synchronizer is arranged between the output end of the comparator and a second input end of the first counter, and is used for synchronizing signal transmission between a reference clock domain of the reference clock signal and a self-activation clock domain of the self-activation clock signal.

By arranging the synchronizer, a probability of a metastable state can be reduced, and the counter can be prevented from misjudging due to an error in control signal transmission.

In an embodiment, the count processing module includes a divider connected to an output end of the first counter. The divider determines delays of each delay unit based on the preset duration, the first counting result, a first parameter and the delay tap coefficient. The first parameter is associated with a duty cycle of the self-activation clock signal.

In an embodiment, the delay clock circuit further includes: a central processing unit, used for controlling a delay clock output from the delay circuit based on the delay. The delay changes with working conditions.

The change in working conditions includes a temperature change of a working environment, a change in a working scene, a change in a process or changes in other circuit physical characteristics.

Referring to temperatures of different working environments, different processes, different other circuit physical characteristics, and different working scenarios, the central processing unit can accurately control the delay circuit based on the obtained delay, to make the stable area of the data align with the clock edge, thereby ensuring that the reception source can stably sample valid data, to reduce the probability of the error in data transmission.

Figure 2:
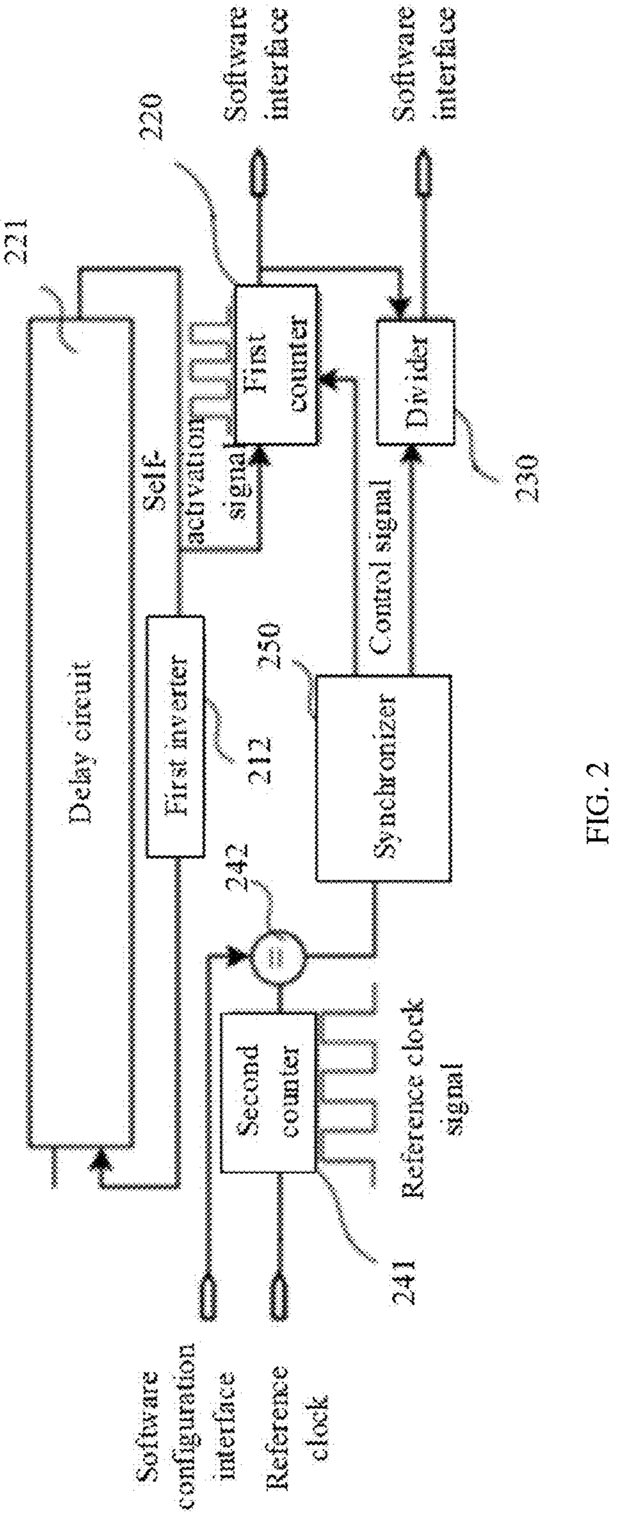
FIG. 2 is a second schematic structural diagram of a delay clock circuit according to an embodiment of the present application.

Referring to FIG. 2, FIG. 2 is a second schematic structural diagram of a delay clock circuit according to an embodiment of the present application.

The self-activation module includes a delay circuit 211 and a first inverter 212. An input end of the first inverter 212 is connected to an output end of the delay circuit 211, and an output end of the first inverter 212 is connected to a second input end of the delay circuit 211. A node between an output end of the delay circuit 211 and an input end of the first inverter 212 may be used as an output end of the self-activation module for outputting a self-activation clock signal.

The output end of the self-activation module is connected to a first input end of a first counter 220, and a first output end of the first counter 220 is connected to a software interface for outputting an intermediate parameter associated with the delay. A second output end of the first counter 220 is connected to a first input end of a divider 230, and an output end of the divider 230 is connected to the software interface for outputting the delay of the delay circuit.

The preset duration module includes a second counter 241 and a comparator 242. An input end of the second counter 241 is connected to a reference clock interface, an output end of the second counter 241 is connected to a first input end of the comparator 242, a second input end of the comparator 242 is connected to a software configuration interface, and an output end of the comparator 242 is connected to an input end of a synchronizer 250. A first output end of the synchronizer 250 is connected to a control end of the first counter 220, and a second output end of the synchronizer 250 is connected to a second input end of the divider 230.

A working principle of the delay clock circuit is as follows.

The software configuration interface is a window for interacting software with hardware. The software configures a reasonable count value a (which is assumed to be 10000) for the second counter through a register. A counting unit driven by a standard reference clock is used for counting and synchronizing the control signal to the self-activated clock domain through the synchronizer. It is assumed that a cycle frequency of the standard reference clock is 125 MHz (whose cycle is 8 ns). In case that a value count of the second counter reaches the configured value a, valid time (i.e. the preset duration) is 10000*8 ns=80000 ns.

The first counter may be driven by the self-activation clock signal, and the count value may be arbitrarily processed and detected by a central processing unit (CPU) through the software interface.

The software configuration interface controls count enable of the first counter and the second counter simultaneously. When the self-activated clock is stable, the count enable is turned on. The first counter and the second counter in FIG. 2 would start counting simultaneously. When the second counter counts to the configured value a, the comparator simultaneously generate a stop counting signal. The stop counting signal is synchronized to the self-activated clock domain through the synchronizer, to control the first counter to stop counting. The count value b of the first counter would be loaded into the divider for calculation. It is assumed that the value b is 9990, this value means that a number of counts of a right counter is 9990 times within 80000 ns, and the delay may be calculated by 80000/b/c.

c is the first parameter, and the first parameter c is associated with the duty cycle of the self-activation clock signal. In an embodiment, in case that the duty cycle of the self-activation clock signal is 50%, c takes a value of 2, that is, the delay calculated by 80000/b/2 is about 4.0040 ns.

In combination with the tap coefficient of the delay circuit, a precise delay time of each level of the delay circuit (it is assumed that the delay circuit is composed of 16 delay units, that is, the circuit has 16 levels of adjustable coefficients) may be calculated to be 80000/b/2/16, which is 250 ps.

When the delays of each delay unit in the delay chain are calculated, these values would be written into the register accessible to the CPU. The CPU can accurately control the delay of RGMII under different processes, different temperatures, and different working scenarios based on the above algorithm.

Based on the above solutions, this embodiment provides a delay controllable and flexible adjustable delay clock circuit to satisfy the application requirement of RGMII in different scenarios. The delay clock circuit can realize software and hardware collaboration, the RGMII delay clock window is precisely controllable, and the circuit structure is simple and easy to implement.

In an embodiment, the delay circuit includes a second inverter, a first multiplexer and a delay chain. An input end of the second inverter is connected to an input clock interface, a first input end of the first multiplexer is connected to an output end of the second inverter, a second input end of the first multiplexer is connected to the input clock interface, an output end of the first multiplexer is connected to an input end of the delay chain, and the delay chain outputs a delay clock signal.

The delay chain includes a plurality of cascaded delay units and a second multiplexer. Each delay unit is connected to the second multiplexer.

A control end of the second multiplexer is connected to the central processing unit, and a delay tap coefficient of the delay chain is determined based on a control instruction of the central processing unit. The delay tap coefficient is used for determining a number of delay units in the delay chain.

A control end of the first multiplexer is connected to the central processing unit, and whether a signal of the first input end enters the delay chain or a signal of the second input end enters the delay chain is determined based on the control instruction of the central processing unit. Therefore, the first multiplexer is used for determining positive and negative polarities of the signal entering the delay chain.

In addition, since the signal of the first input end of the first multiplexer has been processed by the second inverter, an offset of a clock phase may be controlled to the maximize extent.

In an embodiment, the delay chain includes a plurality of cascaded delay units, each delay unit includes two groups of inverters connected end to end. Adopting an inverter as a basic component of the delay chain can not only ensure that the duty cycle of the clock signal is approximately equal to 50% (which satisfies the protocol requirements), but also make the circuit as simple as possible in terms of structure and easy to implement.

Figure 3:
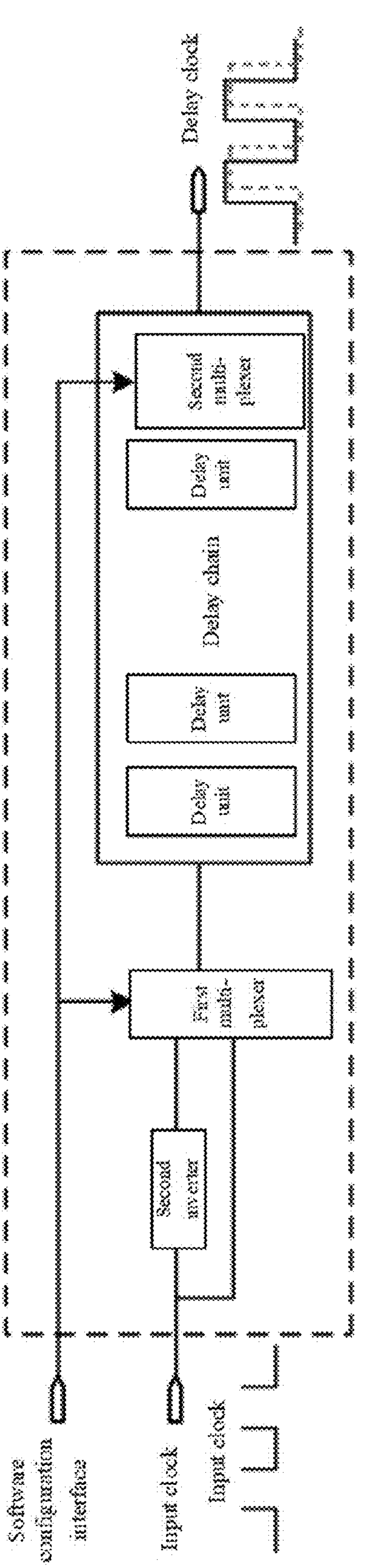
FIG. 3 is a schematic structural diagram of a delay circuit in a delay clock circuit according to an embodiment of the present application.

Referring to FIG. 3, FIG. 3 is a schematic structural diagram of a delay circuit in a delay clock circuit according to an embodiment of the present application. The input end of the second inverter is connected to the input clock interface, for receiving an input clock signal. The output end of the second inverter is connected to the first input end of the first multiplexer, and the second input end of the first multiplexer is connected to the input clock interface.

The output end of the first multiplexer is connected to the input end of the delay chain, and the output end of the delay chain outputs the delay clock signal.

The central processing unit is connected to the control end of the first multiplexer and the control end of the second multiplexer respectively through the software configuration interface.

In the clock signal shown in FIG. 3, a solid line represents the input clock signal, and a dotted line represents the output delay clock signal.

A working principle of the delay clock circuit is as follows. The clock signal (such as T/RXC of the RGMII interface) enters the second inverter from the input port. The second inverter may control the positive and negative polarities of the clock signal entering the delay chain, so as to control of the delay of the clock signal phase to the maximize extent. The delay size of the clock signal entering the delay chain may be determined by the delay tap coefficient, which may be flexibly configured by a software through the configuration interface. That is, it is regarded as being controlled by the central processing unit, to accurately control a phase relationship of an output clock relative to an input clock, and achieve a final delay effect.

Figures 4, 5:
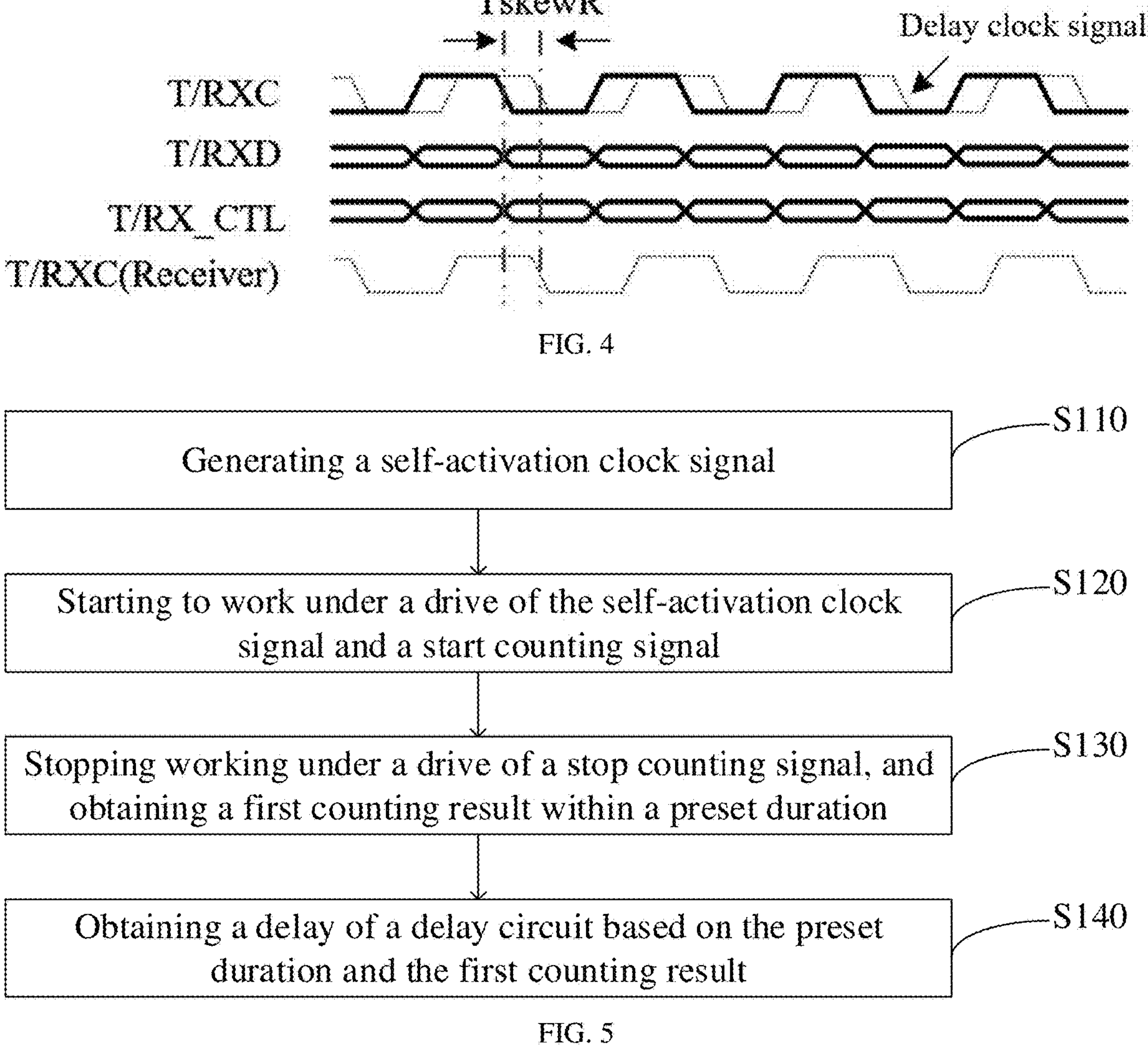
FIG. 4 is a reduced gigabit media independent interface (RGMII) timing diagram of applying a delay clock circuit according to an embodiment of the present application.
FIG. 5 is a first schematic flow chart of a method for determining delay of delay clock circuit according to an embodiment of the present application.

After the clock signal TXC/RXC of RGMII passes through the delay clock circuit, the data reaches a stable state relative to the clock. A subsequent-stage circuit sampling the data at the clock edge would not cause a sampling error due to data instability. Referring to FIG. 4, FIG. 4 is a reduced gigabit media independent interface (RGMII) timing diagram of applying a delay clock circuit according to an embodiment of the present application.

A solid line represents the input clock signal, and a dotted line represents the output delay clock signal. TskewR is the delay. T/RXC, T/RXD and T/RX_CTL are different interfaces in RGMII respectively. The T/RXC interface is configured to receive/transmit the clock signal; the T/RX_CTL interface is configured to receive/transmit the control signal; the T/RXD interface is configured to receive/transmit the data signal. The T/RXC (receiver) represents the clock signal received/transmitted from a subsequent-stage circuit.

The present application further provides a signal transmission device. In an embodiment, the signal transmission device may include a signal processing circuit, a signal transmission circuit and the above-mentioned delay clock circuit.

The delay clock circuit is used for determining a delay of the delay circuit. The signal processing circuit is used for introducing a skew determined based on the delay between clock information and data information to obtain target data, where the skew is determined based on the delay, or the signal processing circuit is used for determining to introduce a skew between clock information and data information based on the delay and target data, where the skew is determined based on the delay and target data. The signal transmission circuit is used for transmitting the target data to a receiver, or to receiving the target data transmitted from a transmitter.

In an embodiment, the signal transmission device may be a signal transmitting device or a signal receiving device, and the delay clock circuit may be applied in the signal transmitting device or the signal receiving device.

In case that the signal transmission device includes a signal transmission device, the signal transmission device is equivalent to a signal transmission end, and the delay clock circuit may be used for determining the delay of the delay circuit. The signal processing circuit may be used for introducing the skew determined based on the delay between the clock information and the data information to obtain the to-be-transmitted target data. The signal transmission circuit includes a signal transmission circuit, and the signal transmission circuit is used for transmitting the to-be-transmitted target data to the receiver.

In case that the signal transmission device includes a signal receiving device, the signal transmission device is equivalent to a signal receiver, and the signal transmission circuit includes a signal receiving circuit, and the signal receiving circuit is used for receiving the target data transmitted from the transmitter. The signal processing circuit may be used for determining the skew between the clock information and the data information based on the delay and the target data, that is, to parse and process the received target data. The above explanation of the delay clock circuit is also applicable to the signal transmission device of this embodiment. Taking the signal transmitting device as an example, the accurate delay of the delay circuit in different application scenarios may be obtained by the delay clock circuit. The signal processing circuit may introduce skew into the clock signal and the data signal based on the delay, to make the stable area of the data signal and the edge of the clock signal align, thereby ensuring that after the signal transmission circuit transmits the target data, the receiver can stably sample valid data to reduce the probability of the error in data transmission.

A working principle of the signal receiving device is a inverse processing process of the signal transmitting device. Those skilled in the art should be able to understand it based on the signal transmitting device, and would not be repeated here.

In an embodiment, the signal transmission device may further include a signal receiving device and a signal transmitting device, that is, it has functions of signal transmitting and signal receiving simultaneously.

The present application further provides a method for determining delay of delay clock circuit. Referring to FIG. 5, FIG. 5 is a first schematic flow chart of a method for determining delay of delay clock circuit according to an embodiment of the present application. In this embodiment, the method for determining delay of delay clock circuit includes steps S110 to S160, and each step is as follows.

S110: generating a self-activation clock signal.

The self-activation clock signal may be generated by a self-activated module. The self-activated module includes a delay circuit and a first inverter.

S120: starting to work under a drive of the self-activation clock signal and a start counting signal.

S130: stopping working under a drive of a stop counting signal, and obtaining a first counting result within a preset duration.

The preset duration is a time interval between the start counting signal and the stop counting signal.

S140: obtaining a delay of a delay circuit based on the preset duration and the first counting result.

The method for determining delay of delay clock circuit also has the beneficial effect of the above-mentioned delay clock circuit: the first counter starts to count under the drive of the self-activation clock signal, and compares the first counting result with the preset duration. Calculations associated with an accumulated delay of the delay circuit can be performed, and an accurate delay of the delay circuit is obtained. The delay of the delay circuit may characterize working parameters of the delay circuit in different application scenarios. Therefore, an application requirement of a controllable and flexible adjustable delay of the delay circuit in different scenarios is satisfied.

In an embodiment, before starting to work under the drive of a self-activation clock signal and a start counting signal, the method further includes:

- generating a start counting signal; working under a drive of a reference clock signal and the start counting signal to obtain a second counting result.

In an embodiment, before the step of stopping working under the drive of the stop counting signal, and obtaining the first counting result within the preset duration, the method further includes:

- receiving a preset value output from a central processing unit; and generating the stop counting signal in case that the second counting result is equal to the preset value, where the preset duration is determined based on a reference clock cycle of the reference clock signal and the second counting result.

Figure 6:
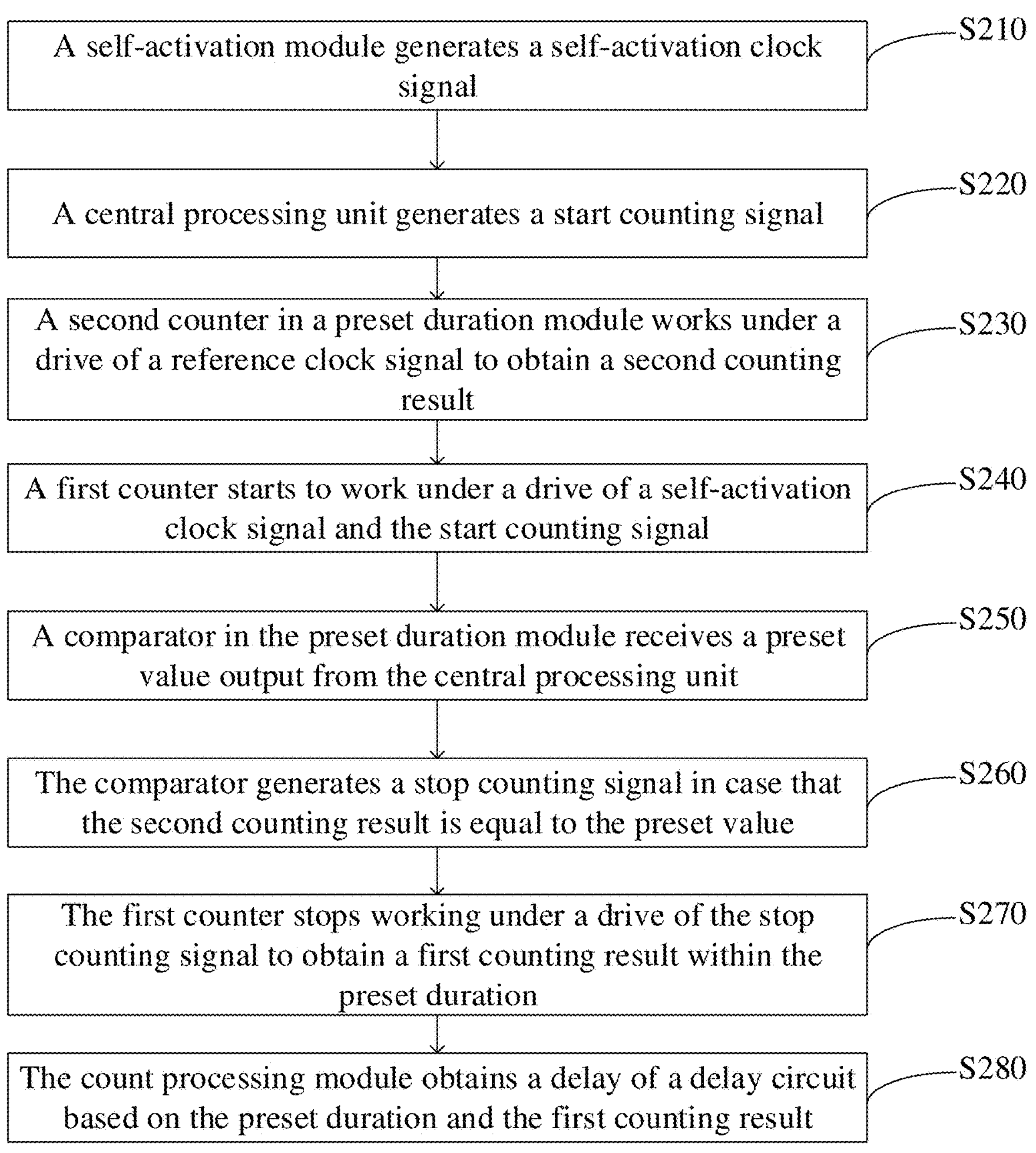
FIG. 6 is a second schematic flow chart of a method for determining a delay of a delay clock circuit according to an embodiment of the present application.

Referring to FIG. 6, FIG. 6 is a second schematic flow chart of a method for determining a delay of a delay clock circuit according to an embodiment of the present application. In this embodiment, the method for determining delay of delay clock circuit includes steps S210 to S270, and each step is as follows.

S210: a self-activation module generates a self-activation clock signal.

S220: a central processing unit generates a start counting signal.

S230: a second counter in a preset duration module works under a drive of a reference clock signal to obtain a second counting result.

S240: a first counter starts to work under a drive of a self-activation clock signal and the start counting signal.

S250: a comparator in the preset duration module receives a preset value output from the central processing unit.

S260: the comparator generates a stop counting signal in case that the second counting result is equal to the preset value.

S270: the first counter stops working under a drive of the stop counting signal to obtain a first counting result within the preset duration.

S280: the count processing module obtains a delay of a delay circuit based on the preset duration and the first counting result.

In an embodiment, obtaining the delay of the delay circuit based on the preset duration and the first counting result includes: determining a delay tap coefficient of a delay chain based on a control instruction of the central processing unit, where the delay tap coefficient is used for determining a number of delay units in the delay chain; and determining delays of each delay unit based on the preset duration, the first counting result, a first parameter and the delay tap coefficient, where the first parameter is associated with a duty cycle of the self-activation clock signal.

In an embodiment, after obtaining the delay of the delay circuit based on the preset duration and the first counting result, the method further includes: controlling a delay clock output from the delay circuit based on the delay, where the delay changes with working conditions.

In summary, the present application provides a delay clock circuit, a signal transmission device and a method for determining delay, and relates to the field of circuit technologies. The delay clock circuit includes: a self-activation module, including a first inverter and a delay circuit, and used for generating a self-activation clock signal, where the first inverter is connected to an input end of the delay circuit and an output end of the delay circuit respectively; a first counter, connected to the self-activation module, and used for starting to work under a drive of the self-activation clock signal and a start counting signal and stopping working under a drive of a stop counting signal to obtain a first counting result within a preset duration; and a count processing module, connected to the first counter, and used for obtaining a delay of the delay circuit based on the preset duration and the first counting result. Based on the above modes, the present application can perform calculations based on an accumulated delay counted by the first counter to obtain an accurate delay of the delay circuit. Therefore, an application requirement of a controllable and flexible adjustable delay of the delay circuit in different scenarios is satisfied, and stable and reliable data transmission is achieved.

The device embodiments described above are merely illustrative, where the units described as separate components may or may not be physically separate, and the components displayed as units may or may not be physical units, that is, may be located at the same place or be distributed to multiple network units. Some or all of the modules may be selected according to actual needs to achieve the purpose of the solution of the present embodiment. Those of ordinary skill in the art can understand and implement the embodiments described above without paying creative labors.

Through the description of the embodiments above, those skilled in the art can clearly understand that the various embodiments may be implemented by means of software and a necessary general hardware platform, and of course, by hardware. Based on such understanding, the technical solutions of the present application in essence or a part of the technical solutions that contributes to the prior art, or a part of the technical solutions, may be embodied in the form of a software product, which may be stored in a storage medium such as ROM/RAM, magnetic discs, optical discs, etc., and includes several instructions to cause a computer device (which may be a personal computer, server, or network device, etc.) to perform the methods described in various embodiments or a part thereof.

It should be noted that the above embodiments are only used to explain the solutions of the present application, and are not limited thereto; although the present application has been described in detail with reference to the foregoing embodiments, it should be understood by those skilled in the art that modifications to the technical solutions documented in the foregoing embodiments and equivalent substitutions to a part of the features may be made and these modifications and substitutions do not make the essence of the corresponding solutions depart from the scope of solutions of various embodiments of the present application.

What is claimed is:

1. A delay clock circuit, comprising:

a self-activation module, comprising a first inverter and a delay circuit, and used for generating a self-activation clock signal, wherein the first inverter is connected to an input end of the delay circuit and an output end of the delay circuit respectively;

a first counter, connected to the self-activation module, and used for starting to work under a drive of the self-activation clock signal and a start counting signal and stopping working under a drive of a stop counting signal to obtain a first counting result within a preset duration, wherein the preset duration is a time interval between the start counting signal and the stop counting signal; and a counting processor, connected to the first counter, and used for obtaining a delay of the delay circuit based on the preset duration and the first counting result.

2. The delay clock circuit of claim 1, wherein the start counting signal is generated by a central processing unit, and the stop counting signal is generated by a preset duration module comprising a second counter and a comparator, wherein an input end of the second counter is connected to a reference clock interface, the second counter is used for working under a drive of a reference clock signal and the start counting signal to obtain a second counting result;

a first input end of the comparator is connected to an output end of the second counter to obtain the second counting result, a second input end of the comparator is connected to the central processing unit to obtain a preset value, and an output end of the comparator is connected to the first counter; and the comparator is used for comparing the second counting result with the preset value, and generating the stop counting signal in case that the second counting result is equal to the preset value, wherein the preset duration is determined based on a reference clock cycle of the reference clock signal and the second counting result.

3. The delay clock circuit of claim 2, further comprising a synchronizer, wherein a first input end of the first counter is connected to an output end of the self-activation module; and the synchronizer is arranged between the output end of the comparator and a second input end of the first counter, and is used for synchronizing signal transmission between a reference clock domain of the reference clock signal and a self-activation clock domain of the self-activation clock signal.

4. The delay clock circuit of claim 1, wherein the delay circuit comprises a second inverter, a first multiplexer and a delay chain, wherein an input end of the second inverter is connected to an input clock interface, a first input end of the first multiplexer is connected to an output end of the second inverter, a second input end of the first multiplexer is connected to the input clock interface, an output end of the first multiplexer is connected to an input end of the delay chain, and the delay chain outputs a delay clock signal;

the delay chain comprises a plurality of cascaded delay units and a second multiplexer, wherein each delay unit is connected to the second multiplexer; and a control end of the second multiplexer is connected to a central processing unit, and a delay tap coefficient of the delay chain is determined based on a control instruction of the central processing unit, wherein the delay tap coefficient is used for determining a number of delay units in the delay chain.

5. The delay clock circuit of claim 4, wherein the counting processor comprises a divider connected to an output end of the first counter, wherein the divider determines delays of each delay unit based on the preset duration, the first counting result, a first parameter and the delay tap coefficient, wherein the first parameter is associated with a duty cycle of the self-activation clock signal.

6. The delay clock circuit of claim 1, further comprising:

a central processing unit, used for controlling a delay clock output from the delay circuit based on the delay, wherein the delay changes with working conditions.

7. A signal transmission device, comprising a signal processing circuit, a signal transmission circuit and a delay clock circuit of claim 1, wherein the delay clock circuit is used for determining a delay of the delay circuit, the signal processing circuit is used for introducing a skew between clock information and data information to obtain target data, wherein the skew is determined based on the delay, or the signal processing circuit is used for determining to introduce a skew between clock information and data information, wherein the skew is determined based on the delay and target data; and the signal transmission circuit is used for transmitting the target data to a receiver, or receiving the target data transmitted by a transmitter.

8. A signal transmission device, comprising a signal processing circuit, a signal transmission circuit and a delay clock circuit of claim 2, wherein the delay clock circuit is used for determining a delay of the delay circuit, the signal processing circuit is used for introducing a skew between clock information and data information to obtain target data, wherein the skew is determined based on the delay, or the signal processing circuit is used for determining to introduce a skew between clock information and data information, wherein the skew is determined based on the delay and target data; and the signal transmission circuit is used for transmitting the target data to a receiver, or for receiving the target data transmitted by a transmitter.

9. A signal transmission device, comprising a signal processing circuit, a signal transmission circuit and a delay clock circuit of claim 3, wherein the delay clock circuit is used for determining a delay of the delay circuit, the signal processing circuit is used for introducing a skew between clock information and data information to obtain target data, wherein the skew is determined based on the delay, or the signal processing circuit is used for determining to introduce a skew between clock information and data information, wherein the skew is determined based on the delay and target data; and the signal transmission circuit is used for transmitting the target data to a receiver, or for receiving the target data transmitted by a transmitter.

10. A signal transmission device, comprising a signal processing circuit, a signal transmission circuit and a delay clock circuit of claim 4, wherein the delay clock circuit is used for determining a delay of the delay circuit, the signal processing circuit is used for introducing a skew between clock information and data information to obtain target data, wherein the skew is determined based on the delay, or the signal processing circuit is used for determining to introduce a skew between clock information and data information, wherein the skew is determined based on the delay and target data; and the signal transmission circuit is used for transmitting the target data to a receiver, or for receiving the target data transmitted by a transmitter.

11. A signal transmission device, comprising a signal processing circuit, a signal transmission circuit and a delay clock circuit of claim 5, wherein the delay clock circuit is used for determining a delay of the delay circuit, the signal processing circuit is used for introducing a skew between clock information and data information to obtain target data, wherein the skew is determined based on the delay, or the signal processing circuit is used for determining to introduce a skew between clock information and data information, wherein the skew is determined based on the delay and target data; and the signal transmission circuit is used for transmitting the target data to a receiver, or for receiving the target data transmitted by a transmitter.

12. A signal transmission device, comprising a signal processing circuit, a signal transmission circuit and a delay clock circuit of claim 6, wherein the delay clock circuit is used for determining a delay of the delay circuit, the signal processing circuit is used for introducing a skew between clock information and data information to obtain target data, wherein the skew is determined based on the delay, or the signal processing circuit is used for determining to introduce a skew between clock information and data information, wherein the skew is determined based on the delay and target data; and the signal transmission circuit is used for transmitting the target data to a receiver, or for receiving the target data transmitted by a transmitter.

13. A method for determining delay of delay clock circuit, comprising:

generating a self-activation clock signal, wherein the self-activation clock signal is generated by a self-activated module, and the self-activated module comprises a delay circuit and a first inverter;

starting to work under a drive of the self-activation clock signal and a start counting signal;

stopping working under a drive of a stop counting signal, and obtaining a first counting result within a preset duration, wherein the preset duration is a time interval between the start counting signal and the stop counting signal; and obtaining a delay of the delay circuit based on the preset duration and the first counting result.

14. The method of claim 13, wherein before starting to work under the drive of the self-activation clock signal and the start counting signal, the method further comprises:

generating the start counting signal;

working under a drive of a reference clock signal and the start counting signal to obtain a second counting result; and before the step of stopping working under the drive of the stop counting signal, and obtaining the first counting result within the preset duration, the method further comprises:

receiving a preset value output from a central processing unit; and generating the stop counting signal in case that the second counting result is equal to the preset value, wherein the preset duration is determined based on a reference clock cycle of the reference clock signal and the second counting result.

15. The method of claim 14, wherein obtaining the delay of the delay circuit based on the preset duration and the first counting result, comprises:

determining a delay tap coefficient of a delay chain based on a control instruction of the central processing unit, wherein the delay tap coefficient is used for determining a number of delay units in the delay chain; and determining delays of each delay unit based on the preset duration, the first counting result, a first parameter and the delay tap coefficient, wherein the first parameter is associated with a duty cycle of the self-activation clock signal.

16. The method of claim 13, wherein after obtaining the delay of the delay circuit based on the preset duration and the first counting result, the method further comprises:

controlling a delay clock output from the delay circuit based on the delay, wherein the delay changes with working conditions.

17. The method of claim 14, wherein after obtaining the delay of the delay circuit based on the preset duration and the first counting result, the method further comprises:

controlling a delay clock output from the delay circuit based on the delay, wherein the delay changes with working conditions.

18. The method of claim 15, wherein after obtaining the delay of the delay circuit based on the preset duration and the first counting result, the method further comprises:

controlling a delay clock output from the delay circuit based on the delay, wherein the delay changes with working conditions.

* * * * *